United States Patent
Kim

(10) Patent No.: US 9,136,808 B2
(45) Date of Patent: Sep. 15, 2015

(54) SIGNAL PROCESSING APPARATUS AND METHOD

(71) Applicant: SAMSUNG ELECTRONICS CO., LTD., Suwon-si (KR)

(72) Inventor: JongPal Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 13/968,027

(22) Filed: Aug. 15, 2013

(65) Prior Publication Data

US 2014/0203873 A1    Jul. 24, 2014

(30) Foreign Application Priority Data

Jan. 24, 2013 (KR) .................. 10-2013-0008021

(51) Int. Cl.
    *H03F 3/45* (2006.01)
(52) U.S. Cl.
    CPC ........ *H03F 3/45928* (2013.01); *H03F 3/45475* (2013.01)
(58) Field of Classification Search
    CPC ...................................................... H03F 3/45
    USPC ................... 330/258, 259, 254, 260, 261
    See application file for complete search history.

(56) References Cited

U.S. PATENT DOCUMENTS

| | | | |
|---|---|---|---|
| 5,142,238 A | 8/1992 | White | |
| 5,300,896 A | 4/1994 | Suesserman | |
| 7,012,463 B2* | 3/2006 | Nairn | 330/9 |
| 7,831,234 B2* | 11/2010 | Schelmbauer et al. | 455/323 |
| 7,834,696 B2* | 11/2010 | Giotta et al. | 330/258 |
| 7,994,863 B2* | 8/2011 | Schneider et al. | 330/297 |
| 8,031,000 B2* | 10/2011 | Ishii | 330/259 |
| 8,044,718 B2* | 10/2011 | Nicollini et al. | 330/86 |
| 2001/0021813 A1 | 9/2001 | Yonce | |
| 2005/0134380 A1* | 6/2005 | Nairn | 330/258 |

FOREIGN PATENT DOCUMENTS

| | | |
|---|---|---|
| KR | 10-2005-0096296 A | 10/2005 |
| KR | 10-1094705 | 12/2011 |

* cited by examiner

*Primary Examiner* — Henry Choe
(74) *Attorney, Agent, or Firm* — NSIP Law

(57) ABSTRACT

A signal processing apparatus and method are disclosed. A common mode signal extraction unit is configured to extract a common mode signal from input signals inputted to a differential amplifier. A common mode signal adjustment unit is configured to adjust a gain and a phase of the common mode signal and to output the adjusted common mode signal to the differential amplifier. An optimal set determination unit is configured to determine an optimal gain and phase to be applied to the common mode signal based on an output signal from the differential amplifier.

19 Claims, 7 Drawing Sheets

SIGNAL PROCESSING APPARATUS AND METHOD

CROSS-REFERENCE TO RELATED APPLICATION

This application claims the benefit under 35 U.S.C. §119 (a) of Korean Patent Application No. 10-2013-0008021, filed on Jan. 24, 2013, in the Korean Intellectual Property Office, the entire disclosure of which is incorporated herein by reference for all purposes.

BACKGROUND

1. Field

The following description relates to a signal processing apparatus and method that enhances a common mode rejection ratio (CMRR) of a signal amplifier by adjusting a common mode signal.

2. Description of Related Art

A differential amplifier may refer to a circuit that amplifies a voltage difference between two input signals. During operation of the differential amplifier, a single-ended operation may apply an input signal to a single input terminal only and ground a remainder of input terminals. A double-ended or differential-mode operation may apply two input signals having opposite polarities to the differential amplifier. Further, a common mode operation may apply an identical input signal to two input signals.

In the common mode operation, an output signal of an ideal differential amplifier may be zero. In actuality, however, an output signal may fail to be zero due to various factors. For example, an infinitesimal signal may be output when an identical signal is input as the two input signals. A large signal may be output when an opposite pole signal is inputted. A common mode rejection ratio (CMRR) may refer to a ratio of a differential mode gain to a common mode gain. The CMRR may be used as a standard indicating a performance of the differential amplifier. For example, the differential amplifier has a better performance the higher the CMRR.

SUMMARY

In accordance with an illustrative example, there is provided a signal processing apparatus, including a common mode signal extraction unit configured to extract a common mode signal from input signals inputted to a differential amplifier; a common mode signal adjustment unit configured to adjust a gain and a phase of the common mode signal and to output the adjusted common mode signal to the differential amplifier; and an optimal set determination unit configured to determine an optimal gain and phase to be applied to the common mode signal based on an output signal from the differential amplifier.

The optimal set determination unit may be further configured to determine the optimal gain and phase of the common mode signal that minimizes an amplitude of the output signal of the differential amplifier.

The common mode signal adjustment unit may be further configured to send as feedback the adjusted common mode signal to an input terminal of the differential amplifier.

The common mode signal adjustment unit may be further configured to transmit as feedback the adjusted common mode signal by gradually varying the gain and the phase of the common mode signal to an input terminal of the differential amplifier.

The optimal set determination unit may be configured to measure an amplitude of the output signal of the differential amplifier corresponding to feedback received, and identify the optimal gain and phase of the common mode signal that minimizes the amplitude of the output signal.

The signal processing apparatus may further include a mode control unit configured to determine the optimal gain and phase to be applied to the common mode signal when a first mode is selected, and configured to output the optimal set of the gain and the phase determined in the first mode by applying the optimal gain and phase to the common mode signal when a second mode is selected.

During the second mode, the common mode signal adjustment unit may be further configured to output to the input terminal of the differential amplifier the common mode signal to which the gain and the phase determined in the first mode are applied.

In accordance with another illustrative example, there is provided a signal processing apparatus, including a differential amplifier configured to amplify a difference between input signals and output an output signal indicative of a difference between the input signals; and a common mode signal control unit configured to control a gain and a phase of a common mode signal to be sent as feedback to an input terminal of the differential amplifier based on the output signal from the differential amplifier.

The common mode signal control unit may be configured to determine the gain and the phase of the common mode signal that minimizes an amplitude of the output signal of the differential amplifier to be the gain and the phase of the common mode signal to be sent as feedback to the input terminal of the differential amplifier.

The common mode signal control unit may be configured to transmit as feedback, to the input terminal of the differential amplifier, a gradual variation of the gain and the phase of the common mode signal The common mode signal control unit may be configured to determine a gain and a phase to be applied to a common mode signal extracted from input signals based on an output signal of the differential amplifier during a first mode.

The common mode signal control unit may be configured to output to an input terminal of the differential amplifier, the common mode signal to which the gain and the phase determined are applied during a second mode.

In accordance with an illustrative example, there is provided a signal processing method, including extracting a common mode signal from input signals inputted to a differential amplifier; adjusting a gain and a phase of the common mode signal and outputting the adjusted common mode signal to the differential amplifier; and determining an optimal gain and phase to be applied to the common mode signal based on an output signal from the differential amplifier.

The determining of the optimal set may include determining the optimal gain and phase of the common mode signal that minimizes an amplitude of an output signal of the differential amplifier.

The outputting of the gain and the phase may include sending feedback, to an input terminal of the differential amplifier, of the adjusted common mode signal.

The outputting of the gain and the phase may include sending feedback, to the input terminal of the differential amplifier, including the adjusted common mode signal by gradually varying the gain and the phase of the common mode signal.

The outputting of the gain and the phase may further include measuring an amplitude of the output signal of the differential amplifier corresponding to feedback received, and identifying the optimal gain and phase of the common mode signal that minimizes the amplitude of the output signal.

The outputting of the gain and the phase may include outputting, to an input terminal of the differential amplifier, the common mode signal to which the optimal gain and phase are applied.

In accordance with an illustrative example, there is provided a non-transitory computer-readable medium including a program for instructing a computer to perform the method described above.

Other features and aspects will be apparent from the following detailed description, the drawings, and the claims.

Figure 1:
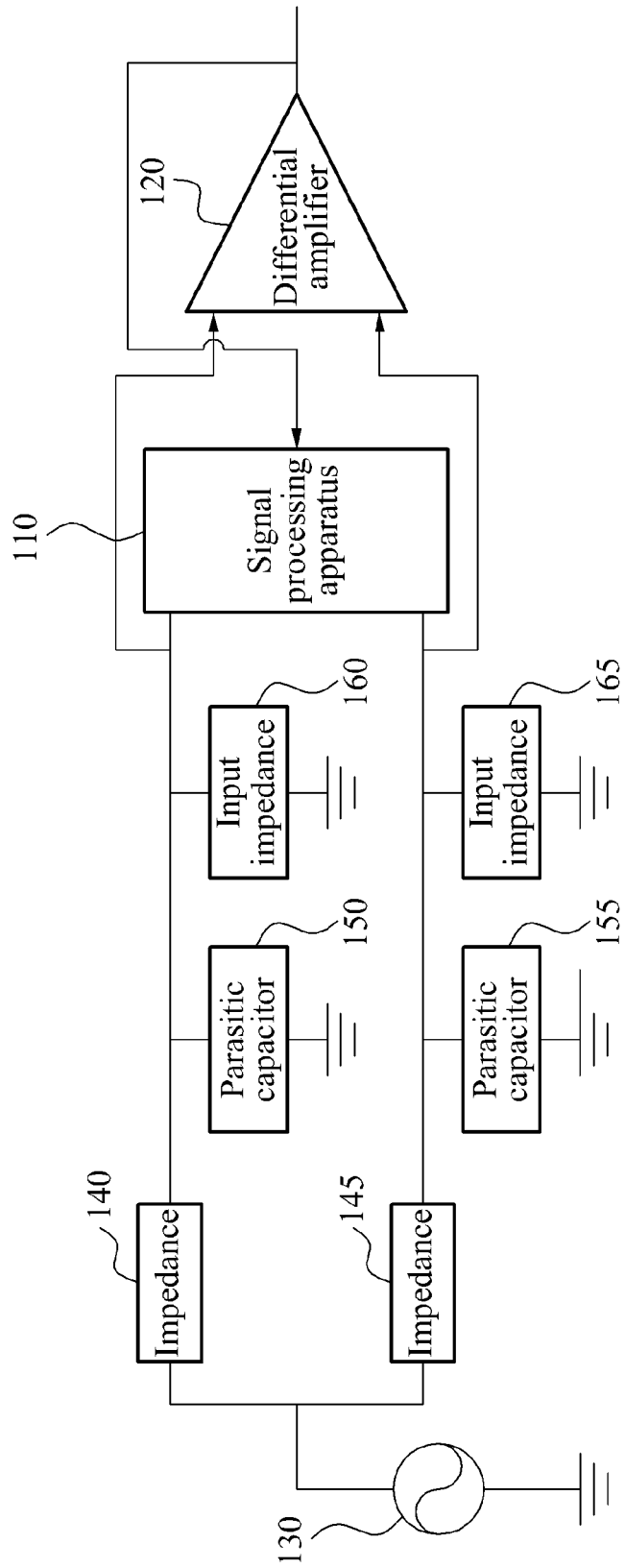
FIG. 1 is a diagram illustrating an example of a signal processing apparatus, in accordance with an illustrative configuration.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 illustrates an example of a signal processing apparatus 110, in accordance with an illustrative configuration.

Referring to FIG. 1, a circuit model of a physiological signal measurement system including the signal processing apparatus 110 is illustrated. As an illustrative example, the signal processing apparatus 110 operates in a common mode in which a common input signal 130 is applied to the circuit model. The circuit model includes impedance 140 and 145, parasitic capacitors 150 and 155, and input impedance 160 and 165 of a differential amplifier 120.

The parasitic capacitors 150 and 155 may generate unwanted noise electricity to be grounded and may reduce an overall size of the input impedance of the differential amplifier 120. When sizes of the parasitic capacitors 150 and 155 are not identical, noise may be generated. Such noise could be generated through a common signal component generated through a power supply line flowing into a measured signal. As a result, a common mode rejection ratio (CMRR) of the differential amplifier 120 may be reduced.

The signal processing apparatus 110 extracts a common mode signal from input signals also inputted to the differential amplifier 120, and outputs an adjusted gain or an adjusted amplitude of the common mode signal. The signal processing apparatus 110 outputs a phase of the common mode signal extracted by adjusting the phase.

The signal processing apparatus 110 enhances the CMRR reduced by the parasitic capacitors 150 and 155 by adjusting the common mode signal input to the differential amplifier 120. In one example, in the common mode, the signal processing apparatus 110 adjusts the gain and the phase of the common mode signal based on an output signal of the differential amplifier 120. In other words, the signal processing apparatus 110 determines a gain and a phase of a common mode signal that minimizes an amplitude of the output signal of the differential amplifier 120 by gradually adjusting the gain and the phase of the common mode signal.

When the gain and the phase of the common mode signal that minimizes the amplitude of the output signal is determined, the signal processing apparatus 110 adjusts the common mode signal extracted based on the gain and the phase of the common mode signal determined. Also, the signal processing apparatus 110 sends as feedback the adjusted common mode signal to an input terminal of the differential amplifier 120. For example, in a differential mode in which differing input signals are input to a circuit model, the signal processing apparatus 110 adjusts the common mode signal based on the gain and the phase of the common mode signal that minimizes the amplitude of the output signal continuously. The signal processing apparatus 110 also outputs the adjusted common mode signal to the input terminal of the differential amplifier 120.

Figure 2:
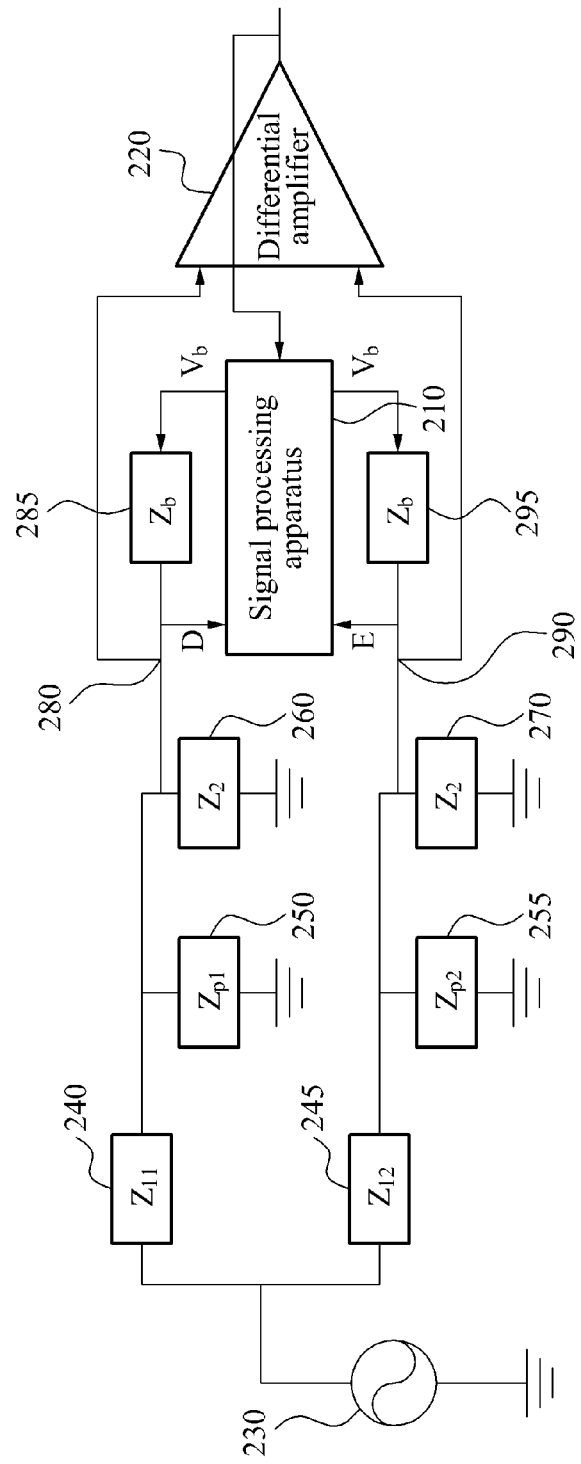
FIG. 2 is a diagram illustrating an example of a process to calculate an optimal gain and phase of a common mode signal, in accordance with an illustrative configuration.

FIG. 2 illustrates an example of a process to calculate an optimal gain and phase of a common mode signal, in accordance with an illustrative configuration.

With reference to FIG. 2, in an illustrative configuration, a circuit model and equations are discussed below to enable a signal processing apparatus 210 to control a gain and a phase of a common mode signal in order to enhance a CMRR of a differential amplifier 220.

Referring to FIG. 2, a circuit model of a common mode may include an interface impedance $Z_{11}$ 240, an interface impedance $Z_{12}$ 245, a parasitic capacitor $Z_{p1}$ 150, a parasitic capacitor $Z_{p2}$ 155, and input impedances $Z_2$ 260 and 270 of the differential amplifier 220. The circuit model of FIG. 2 may further include feedback capacitors $Z_b$ 285 and 295 in two input terminals of the differential amplifier 220.

In one illustrative example, a common input signal $V_s$ 230 is applied to the circuit model, and sizes of a parasitic capacitor $Z_{p1}$ 250 and a parasitic capacitor $Z_{p2}$ 255 differ from one another. In one example, a voltage of a node D 280 is $V_1$, a voltage of a node E 290 is $V_2$, and an output of a common mode signal of which a gain and a phase are adjusted in the signal processing apparatus 210 is $V_b$.

A common mode signal $V_{cm}$ extracted by the signal processing apparatus 210 from an input signal of the differential amplifier 220 is represented by Equation 1 as follows:

$$V_{cm} = \frac{V_1 + V_2}{2}, \quad \text{[Equation 1]}$$

the output $V_b$ of the common mode signal of which the gain and the phase are adjusted in the signal processing apparatus 210 may be defined by Equation 2.

$$V_b = A \cdot V_{cm} \quad \text{[Equation 2]}$$

In Equation 2, A denotes an amplitude of a gain and a phase to be applied in order to adjust the common mode signal $V_{cm}$.

A circuit equation in the node D 280 is represented by Equation 3 as follows.

$$\frac{V_s - V_1}{Z_{11}} + \frac{V_b - V_1}{Z_b} + \frac{0 - V_1}{Z_p + Z_2} = 0 \quad \text{[Equation 3]}$$

A circuit equation in the mode E 290 is expressed as Equation 4 as follows.

$$\frac{V_s - V_2}{Z_{12}} + \frac{V_b - V_2}{Z_b} + \frac{0 - V_2}{Z_p + Z_2} = 0 \quad \text{[Equation 4]}$$

A difference input value $(v_1 - v_2)$ inputted to the differential amplifier 220 in a common mode may be calculated using Equation 5, based on Equation 1 and Equation 4.

$$v_1 - v_2 = \frac{\left(\frac{1}{Z_b} + \frac{1}{Z_{p2} + Z_2} - \frac{A}{Z_b}\right)\frac{1}{Z_{11}} -}{\left(\frac{1}{Z_{11}} + \frac{1}{Z_b} + \frac{1}{Z_{p1} + Z_2} - \frac{A}{2Z_b}\right)} \\ \left(\frac{1}{Z_{12}} + \frac{1}{Z_b} + \frac{1}{Z_{p2} + Z_2} - \frac{A}{2Z_b}\right) - \\ \left(\frac{A}{2Z_b}\right)^2 \quad \text{[Equation 5]}$$

The CMRR of the differential amplifier 220 may be enhanced most when a size of the difference input value $(v_1 - v_2)$ is minimized in the common input signal $V_s$ 230 in the common mode. Accordingly, amplitude A of a gain and a phase to be applied to a common mode signal that makes a numerator of Equation 5 zero is defined by Equation 6.

$$A = 1 + \frac{\frac{1}{Z_{p2} + Z_2} \cdot \frac{Z_{12}}{Z_{11}} - \frac{1}{Z_{p1} + Z_2}}{\left(\frac{Z_{12}}{Z_{11}} - 1\right)\frac{1}{Z_b}} = RL + j \cdot IM \quad \text{[Equation 6]}$$

Based on a result of Equation 6, adjusting the gain and the phase of the common mode signal may be necessary to enhance the CMRR of the differential amplifier 220 to a maximum. Based on the result of Equation 6, $(RL^2 + IM^2)^{0.5}$ denotes an optimal gain to be applied to the common mode signal derived a as result of calculations, and arctan(IM/RL) denotes an optimal phase to be applied to the common mode signal.

Figure 3:
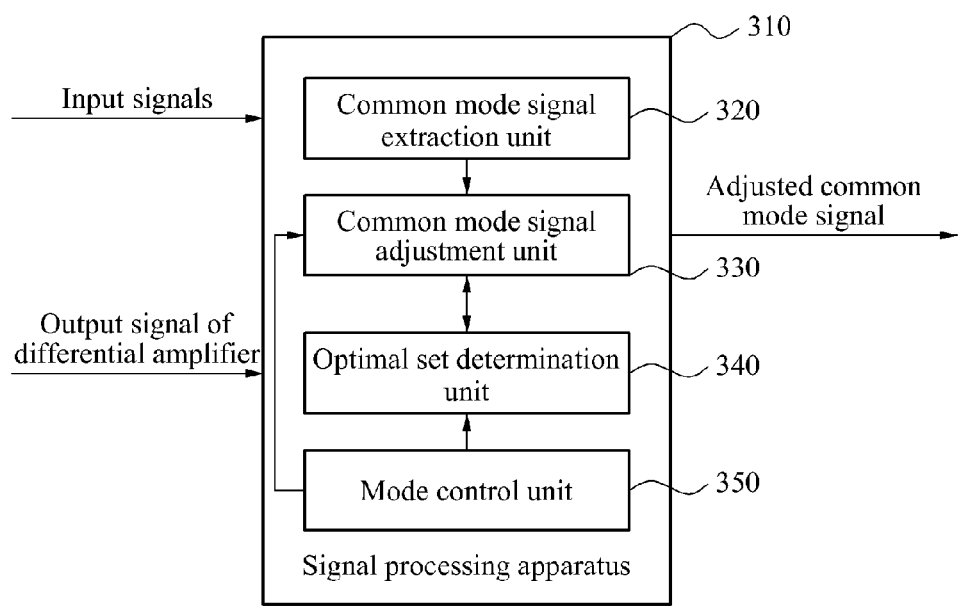
FIG. 3 is a diagram illustrating an example of a configuration of a signal processing apparatus, in accordance with an illustrative configuration.

FIG. 3 illustrates an example of a configuration of a signal processing apparatus 310, in accordance with an illustrative configuration.

Referring to FIG. 3, the signal processing apparatus 310 may include a common mode signal extraction unit 320, a common mode signal adjustment unit 330, and an optimal set determination unit 340. The signal processing apparatus 310 may further include a mode control unit 350.

The common mode signal extraction unit 320 extracts a common mode signal from input signals of a differential amplifier. The common mode extraction unit 320 extracts the common mode signal from input signals measured from input terminals of the differential amplifier.

The common mode signal adjustment unit 330 adjusts a gain and a phase of a common mode signal, and outputs the adjusted common mode signal. More particularly, the common mode signal adjustment unit 330 sends feedback of the adjusted common mode signal to the input terminals of the differential amplifier.

The common mode signal adjustment unit 330 sends feedback of a gain and a phase of a common mode signal to the input terminals of the differential amplifier by varying the gain and the phase of the common mode signal gradually. The common mode signal adjustment unit 330 may also provide information about the gain and the phase of the common mode signal that are gradually varied to the optimal set determination unit 340.

In one example, the optimal set determination unit 340 determines the optimal gain and phase to be applied to the common mode signal based on an output signal of the differential amplifier. More particularly, the optimal set determination unit 340 measures or monitors an amplitude of the output signal of the differential amplifier corresponding to the feedback of the common mode signal adjustment unit 330. The optimal set determination unit 340 further identifies the gain and the phase of the common mode signal that minimizes the amplitude of the output signal. The optimal set determination unit 340 determines the gain and the phase of the common mode signal that minimizes the amplitude of the output signal of the differential amplifier to be the gain and the phase to be applied to the common mode signal.

For example, the common mode signal adjustment unit 330 applies to the input terminals of the differential terminal the common mode signal with a gradually adjusted gain and phase. In this instance, the optimal set determination unit 340 measures the amplitude of the output signal of the differential amplifier corresponding to the common mode signal to which a differing gain and a phase is applied. The optimal set determination unit 340 also identifies a gain and a phase of a common mode signal when the amplitude of the output signal of the differential amplifier is at a minimum.

The mode control unit 350 is configured to determine an optimal gain and phase to be applied to a common mode signal in a first mode. The mode control unit 350 is also configured to output the optimal gain and phase determined in the first mode by applying the optimal gain and phase to the common mode signal in a second mode based on a mode selection.

In the first mode, the mode control unit 350 controls the common mode signal adjustment unit 330 to adjust the gain and the phase of the common mode signal gradually. The mode control unit 350 further controls the optimal set determination unit 340 to identify the gain and the phase of the common mode signal when the amplitude of the output signal of the differential amplifier is at a minimum.

In the second mode in which input signals to be amplified are applied to the input terminals of the differential amplifier, the mode control unit 350 adjusts the common mode signal based on the gain and the phase of the common mode signal determined in the first mode. The mode control unit 350 also controls the adjusted common mode signal to be applied to the input terminals of a common differential amplifier. During the second mode, the common mode signal adjustment unit 330 outputs to the input terminals of the differential amplifier, a common mode signal with the gain and the phase determined in the first mode based on the control of the mode control unit 350. The optimal set determination unit 340 maintains the gain and the phase of the common mode signal determined in the first mode to provide the gain and the phase to the common mode signal adjustment unit 330 during the second mode.

Figure 4:
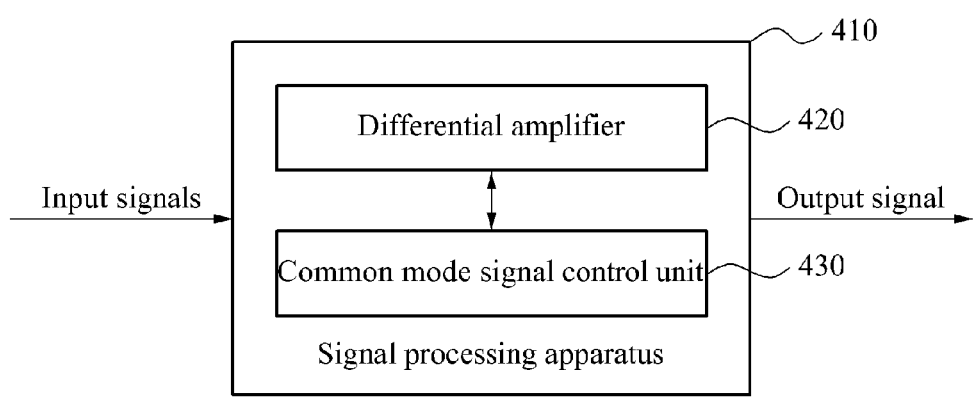
FIG. 4 is a diagram illustrating another example of a configuration of a signal processing apparatus, in accordance with an illustrative configuration.

FIG. 4 illustrates another example of a configuration of a signal processing apparatus 410, in accordance with an illustrative configuration.

Referring to FIG. 4, the signal processing apparatus 410 includes a differential amplifier 420 and a common mode signal control unit 430.

The differential amplifier 420 amplifies and outputs a difference between input signals. In one illustrative example, the differential amplifier 420 has two input terminals, and amplifies and outputs the difference between the input signals input at the two input terminals.

The signal processing apparatus 410 is configured to perform a first mode in which the gain and the phase to be applied to the common mode signal is determined, and perform a second mode in which the difference between the input signals is amplified and output based on the gain and the phase of the common mode signal determined.

In the first mode, the common mode signal control unit 430 may extract the common mode signal using the input signals. The common mode signal control unit 430 controls the gain and the phase of the common mode signal to be sent as feedback to an input terminal of the differential amplifier 420 based on the output signal of the differential amplifier 420. The output signal of the common mode signal control unit 430 is sent as feedback to the input terminal of the differential amplifier 420.

The common mode signal control unit 430 determines the gain and the phase of the common mode signal, which minimizes an amplitude of the output signal of the differential amplifier 420, to be the gain and the phase of the common mode signal to be sent as feedback to the input terminal.

For example, the common mode signal control unit 430 adjusts the gain and the phase of the common mode signal gradually, and identifies and stores the gain and the phase of the common mode signal when the amplitude of the output signal is at a minimum. The common mode signal control unit 430 determines the gain and the phase of the common mode signal identified to be the gain and the phase of the common mode signal, which is to be sent as feedback to the input terminal of the differential amplifier 420.

In the second mode, the common mode signal control unit 430 adjusts the common mode signal based on the gain and the phase of the common mode signal determined in the first mode to send feedback to the difference amplifier 420.

Figure 5:
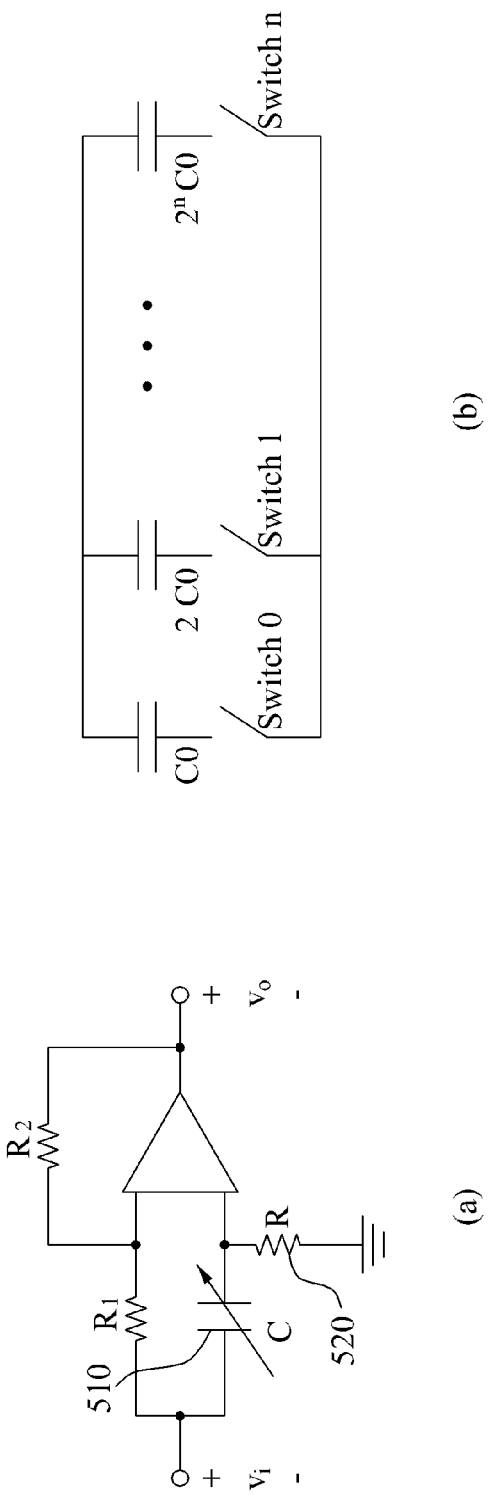
FIG. 5 is a diagram illustrating an example of a circuit adjusting a phase of a common mode signal, in accordance with an illustrative configuration.

FIG. 5 illustrates an example of a circuit adjusting a phase of a common mode signal, in accordance with an illustrative configuration.

Circuit (a) in FIG. 5 illustrates a circuit configured to adjust a phase of a common mode signal. In one illustrative configuration, the circuit illustrated in the circuit (a) refers to a phase lead circuit that adjusts the phase of the common mode signal to lead, and configures a phase lag circuit that adjusts the phase of the common mode signal to lag by exchanging a location of a variable capacitor C 510 and a location of a resistance R 520.

Circuit (b) in FIG. 5 illustrates a circuit configuration of the variable capacitor C 510 of the circuit (a). The variable capacitor C 510 may be configured as a metal-insulator-metal (MIM) capacitor or a metal-oxide-semiconductor (MOS) capacitor.

Figure 6:
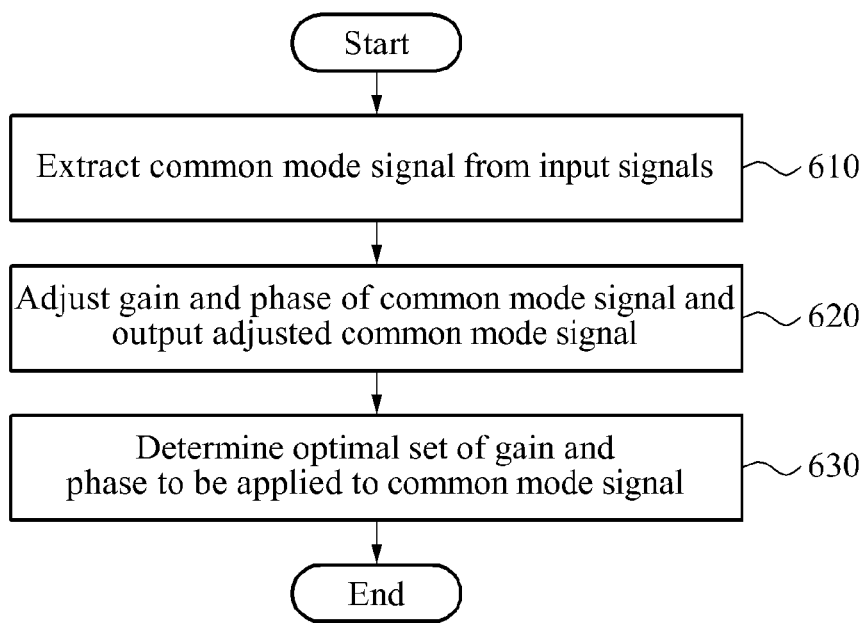
FIG. 6 is a diagram illustrating an example of a signal processing method, in accordance with an illustrative configuration.

FIG. 6 illustrates an example of a signal processing method, in accordance with an illustrative configuration.

At operation 610, the method extracts, at the signal processing apparatus 110, a common mode signal from input signals input to a differential amplifier. The method extracts the common mode signal from an input signal measured at input terminals of a differential amplifier.

In operation 620, the method, performed at the signal processing apparatus 110, for instance, adjusts a gain and a phase of a common mode signal and outputs the adjusted common mode signal. For example, the method sends feedback about the gain and the phase of the common mode signal to an input terminal of the differential amplifier by gradually varying the gain and the phase of the common mode signal.

In operation 630, the method, performed at the signal processing apparatus 110, determines an optimal gain and phase to be applied to a common mode signal based on the output signal of the differential amplifier. In one illustrative example, the signal processing apparatus determines the gain and the phase of the common mode signal, which minimizes an amplitude of an output signal of the differential amplifier, to be the gain and the phase to be applied to the common mode signal.

When the gain and the phase to be applied to the common mode signal are determined, the method sends as feedback the adjusted common mode signal to the input terminal of the differential amplifier.

Figure 7:
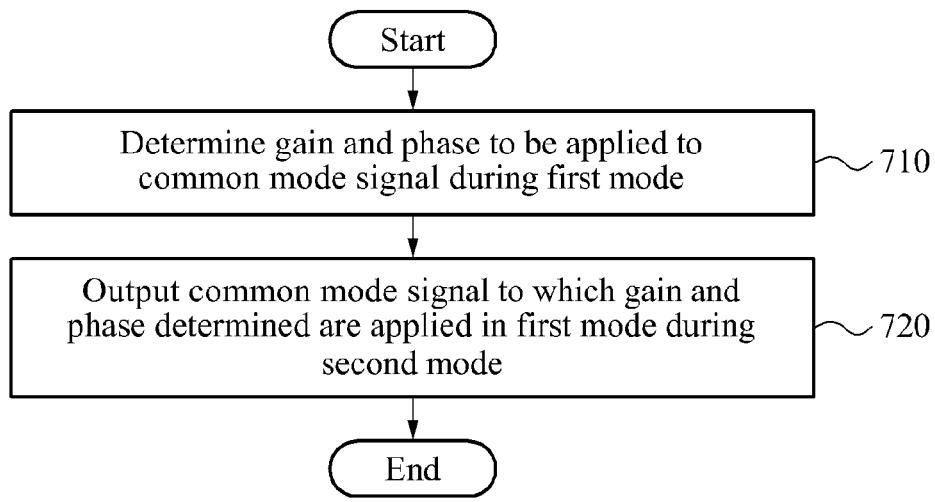
FIG. 7 is a flowchart illustrating an example of a signal processing method, in accordance with an illustrative configuration.

FIG. 7 illustrates an example of a signal processing method, in accordance with an illustrative configuration.

In operation 710, during a first mode, the method, performed at the signal processing apparatus 110, for instance, determines a gain and a phase to be applied to a common mode signal extracted from input signals of a differential amplifier based on an output signal of the differential amplifier.

During the first mode, the method extracts the common mode signal using the input signals inputted to the differential amplifier. The method controls the gain and the phase of the common mode signal, which is to be sent as feedback to an input terminal of the differential amplifier, based on the output signal of the differential amplifier. For example, the method determines the gain and the phase to be applied to the common mode signal by gradually varying the gain and the phase of the common mode signal. The method transmits the feedback of the gain and the phase of the common mode signal to the input terminal of the differential amplifier. The method determines the gain and the phase of the common mode signal that minimizes the amplitude of the output signal of the differential amplifier to be the gain and the phase to be applied to the common mode signal.

For example, the method gradually adjusts the gain and the phase of the common mode signal and identifies and stores the gain and the phase of the common mode signal when the amplitude of the output signal of the differential amplifier is at a minimum. The method determines the gain and the phase of the common mode signal identified to be the gain and the phase of the common mode signal to be sent as feedback to the input terminal of the differential amplifier.

In operation 720, during a second mode, the method outputs to the input terminal of the differential amplifier the common mode signal to which the gain and the phase determined in the first mode are applied. The method adjusts the common mode signal based on the gain and the phase of the common mode signal determined in the first mode. The method further sends as feedback the common mode signal to the input terminal of the differential amplifier. The method enhances the CMRR of the differential amplifier that amplifies a difference between input signals.

The processes, functions, methods and/or software described above including a signal processing method may be recorded, stored, or fixed in one or more non-transitory computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa. In addition, a non-transitory computer-readable storage medium may be distributed among computer systems connected through a network and non-transitory computer-readable codes or program instructions may be stored and executed in a decentralized manner.

The units and apparatuses described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A signal processing apparatus, comprising:
    a common mode signal extraction unit configured to calculate a common mode signal from input signals inputted to a differential amplifier;
    a common mode signal adjustment unit configured to adaptively adjust a gain and a phase of the common mode signal and to output the adjusted common mode signal to the differential amplifier; and
    an optimal set determination unit configured to determine and store a substantially optimal gain and phase to be applied to the common mode signal based on an output signal from the differential amplifier, the optimal gain and phase being stored to increase a common mode rejection ratio (CMRR) of the differential amplifier.

2. The signal processing apparatus of claim 1, wherein the optimal set determination unit is further configured to determine the optimal gain and phase of the common mode signal that minimizes an amplitude of the output signal of the differential amplifier.

3. The signal processing apparatus of claim 1, wherein the common mode signal adjustment unit is further configured to send as feedback the adjusted common mode signal to an input terminal of the differential amplifier.

4. The signal processing apparatus of claim 1, wherein the common mode signal adjustment unit is further configured to transmit as feedback the adjusted common mode signal by gradually varying the gain and the phase of the common mode signal to an input terminal of the differential amplifier.

5. The signal processing apparatus of claim 4, wherein the optimal set determination unit is configured to measure an amplitude of the output signal of the differential amplifier corresponding to feedback received, and identify the optimal gain and phase of the common mode signal that minimizes the amplitude of the output signal.

6. The signal processing apparatus of claim 1, further comprising:
    a mode control unit configured to determine the optimal gain and phase to be applied to the common mode signal when a first mode is selected, and configured to output the optimal gain and the phase determined in the first mode by applying the optimal gain and phase to the common mode signal when a second mode is selected.

7. The signal processing apparatus of claim 6, wherein, during the second mode, the common mode signal adjustment unit is further configured to output to the input terminal of the differential amplifier the common mode signal to which the gain and the phase determined in the first mode are applied.

8. A signal processing apparatus, comprising:
    a differential amplifier configured to amplify a difference between input signals and output an output signal indicative of a difference between the input signals; and
    a common mode signal control unit configured to adaptively adjust a gain and a phase of a calculated common mode signal to be sent as feedback to an input terminal of the differential amplifier based on the output signal from the differential amplifier, a substantially optimal gain and phase according to the output signal being stored to increase a common mode rejection ratio (CMRR) of the differential amplifier.

9. The signal processing apparatus of claim 8, wherein the common mode signal control unit is configured to determine the gain and the phase of the common mode signal that minimizes an amplitude of the output signal of the differential amplifier to be the gain and the phase of the common mode signal to be sent as feedback to the input terminal of the differential amplifier.

10. The signal processing apparatus of claim 8, wherein the common mode signal control unit is configured to transmit as feedback, to the input terminal of the differential amplifier, a gradual variation of the gain and the phase of the common mode signal.

11. The signal processing apparatus of claim 8, wherein the common mode signal control unit is configured to determine a gain and a phase to be applied to a common mode signal extracted from input signals based on an output signal of the differential amplifier during a first mode.

12. The signal processing apparatus of claim 11, wherein the common mode signal control unit is configured to output to an input terminal of the differential amplifier, the common mode signal to which the gain and the phase determined are applied during a second mode.

13. A signal processing method, comprising:
calculating a common mode signal from input signals inputted to a differential amplifier;
adaptively adjusting a gain and a phase of the common mode signal and outputting the adjusted common mode signal to the differential amplifier; and
determining a substantially optimal gain and phase to be applied to the common mode signal based on an output signal from the differential amplifier, the optimal gain and phase being stored to increase a common mode rejection ratio (CMRR) of the differential amplifier.

14. The signal processing method of claim 13, wherein the determining of the optimal gain and phase comprises:
determining the optimal gain and phase of the common mode signal that minimizes an amplitude of an output signal of the differential amplifier.

15. The signal processing method of claim 13, wherein the outputting of the gain and the phase comprises:
sending feedback, to an input terminal of the differential amplifier, of the adjusted common mode signal.

16. The signal processing method of claim 13, wherein the outputting of the gain and the phase comprises:
sending feedback, to the input terminal of the differential amplifier, comprising the adjusted common mode signal by gradually varying the gain and the phase of the common mode signal.

17. The signal processing method of claim 16, wherein the outputting of the gain and the phase further comprises:
measuring an amplitude of the output signal of the differential amplifier corresponding to feedback received, and identifying the optimal gain and phase of the common mode signal that minimizes the amplitude of the output signal.

18. The signal processing method of claim 13, wherein the outputting of the gain and the phase comprises:
outputting, to an input terminal of the differential amplifier, the common mode signal to which the optimal gain and phase are applied.

19. A non-transitory computer-readable medium comprising a program for instructing a computer to perform the method of claim 13.

* * * * *